United States Patent
Yamada

(10) Patent No.: US 6,499,533 B2
(45) Date of Patent: Dec. 31, 2002

(54) COOLING DISK UNIT FOR USE IN A WAFER CHUCKING DEVICE

(75) Inventor: Shunji Yamada, Kanagawa (JP)

(73) Assignee: Sumitomo Heavy Industries, Ltd., Tokyo (JP)

(*) Notice: Subject to any disclaimer, the term of this patent is extended or adjusted under 35 U.S.C. 154(b) by 0 days.

(21) Appl. No.: 09/795,494

(22) Filed: Mar. 1, 2001

(65) Prior Publication Data

US 2001/0045269 A1 Nov. 29, 2001

(30) Foreign Application Priority Data

May 25, 2000 (JP) ........................................ 2000-154533

(51) Int. Cl.[7] ................................................. F28F 3/12
(52) U.S. Cl. ....................... 165/80.1; 165/168; 165/80.4
(58) Field of Search ................................. 165/80.4, 167, 165/168, 170, 80.1

(56) References Cited

U.S. PATENT DOCUMENTS

| | | | | |
|---|---|---|---|---|
| 3,618,412 A | * | 11/1971 | Schmid | 474/8 |
| 3,923,383 A | * | 12/1975 | Engel et al. | 165/170 |
| 4,006,972 A | * | 2/1977 | Nachtman | 359/845 |
| 4,489,570 A | * | 12/1984 | Little | 165/168 |
| 4,535,840 A | * | 8/1985 | Rosman et al. | 165/167 |
| 4,628,991 A | * | 12/1986 | Hsiao et al. | 165/168 |
| 5,005,640 A | * | 4/1991 | Lapinski et al. | 165/142 |
| 5,365,400 A | * | 11/1994 | Ashiwake et al. | 165/80.3 |
| 5,423,376 A | * | 6/1995 | Julien et al. | 165/168 |

FOREIGN PATENT DOCUMENTS

DE 2847292 A1 * 5/1979 ......... F16D/65/853

* cited by examiner

*Primary Examiner*—Allen Flanigan
(74) *Attorney, Agent, or Firm*—Arent Fox Kitner Plotkin & Kahn, PLLC

(57) ABSTRACT

A cooling disk unit is used in a wafer chucking device and comprises first and second heat conducting disks one of which is concentrically superposed on the other in a casing. The first heat conducting disk has a first plurality of radial channels while the second heat conducting disk has a second plurality of radial channels. The first radial channels are connected to the second radial channels at either their inside ends or their outside ends so as to flow a cooling fluid from the first (or second) radial channels to the second (or first) radial channels.

7 Claims, 10 Drawing Sheets

COOLING DISK UNIT FOR USE IN A WAFER CHUCKING DEVICE

BACKGROUND OF THE INVENTION

This invention relates to a cooling disk unit for use in a wafer chucking device.

Generally, in a semiconductor device manufacturing process, an electrical test is performed to check whether or not a semiconductor device (e.g. an integrated circuit) normally operates after the semiconductor device is manufactured on a semiconductor wafer (e.g. a silicon wafer).

When the electrical test is carried out, the semiconductor wafer with the semiconductor device is held by a holder which is called a wafer chucking device to give simulated thermal environment to the semiconductor device. That is, the wafer chucking device holds the semiconductor wafer and heats or cools it. The simulated thermal environment is similar to actual thermal environment in which the semiconductor device will be placed and used.

Formerly, such a test is frequently carried out at relatively high temperature between room temperature and about 150° C. Recently, however, the test is increasingly carried out at relatively low temperature between about 10° C. and about −50° C.

A conventional wafer chucking device has a thick disk shape and comprises a vacuum disk unit or a vacuum chucking unit, an electric heater unit, and a cooling disk unit. The vacuum disk unit, the electric heater unit, and the cooling disk unit are superposed on one another. The vacuum disk unit holds the semiconductor wafer by suction of a vacuum pump connected thereto. The electric heater unit heats the semiconductor wafer through the vacuum disk unit. The cooling disk unit has a passage or tunnel which runs inside thereof to pass a cooling fluid or a heat carrier therethrough. The cooling disk unit is cooled by the cooling fluid and cools the semiconductor wafer through the electric heater unit and the vacuum disk unit.

With this structure, the conventional wafer chucking device can selectively give the relatively high temperature environment or the relatively low temperature environment to the semiconductor wafer as the simulated thermal environment.

However, the cooling disk unit is inefficiently cooled by the cooling fluid and has a low heat transfer rate.

In addition, the cooling disk unit has lack of uniformity in temperature distribution on a main surface on which the electric heater unit is laid.

SUMMARY OF THE INVENTION

It is therefore an object of this invention to provide a cooling disk unit having a high heat transfer rate.

It is another object of this invention to provide a cooling disk unit having a uniform temperature distribution on its main surface.

Other objects of this invention will become clear as the description proceeds.

According to an aspect of this invention, a cooling disk unit is for cooling a wafer chucking device by exchanging heat with a cooling fluid passing therethrough and comprises a first heat conducting disk having a plurality of first radial channels which are connected to one another at both first inside ends and first outside ends. The cooling disk exchanges the heat with the cooling fluid flowing inward in the first radial channels. A second heat conducting disk is concentrically disposed on either a top or a bottom of the first heat conducting disk and has a plurality of second radial channels which are connected to one another at both second inside ends and second outside ends. The second radial channels are further connected to the first radial channels at either one of the second inside ends or the second outside ends. The second heat conducting disk exchanges the heat with the cooling fluid flowing outward in the second radial channels.

According to another aspect of this invention, a wafer chucking device comprises a wafer chucking unit for chucking a semiconductor wafer thereon. A cooling disk unit is disposed under the wafer chucking unit to cool the semiconductor wafer through the wafer chucking unit by passing a cooling fluid therethrough. A first heat conducting disk has a plurality of first radial channels connected to one another at both first inside ends and first outside ends. The cooling disk exchanges the heat with said cooling fluid flowing inward in the first radial channels. A second heat conducting disk is concentrically disposed on either a top or a bottom of the first heat conducting disk and has a plurality of second radial channels which are connected to one another at both second inside ends and second outside ends. The second radial channels are further connected to the first radial channels at either one of the second inside ends or the second outside ends. The second heat conducting disk exchanges the heat with the cooling fluid flowing outward in the second radial channels.

DESCRIPTION OF THE PREFERRED EMBODIMENTS

Referring to FIGS. 1 through 5, description will at first be directed to a conventional wafer chucking device for a better understanding of this invention.

Figure 1:
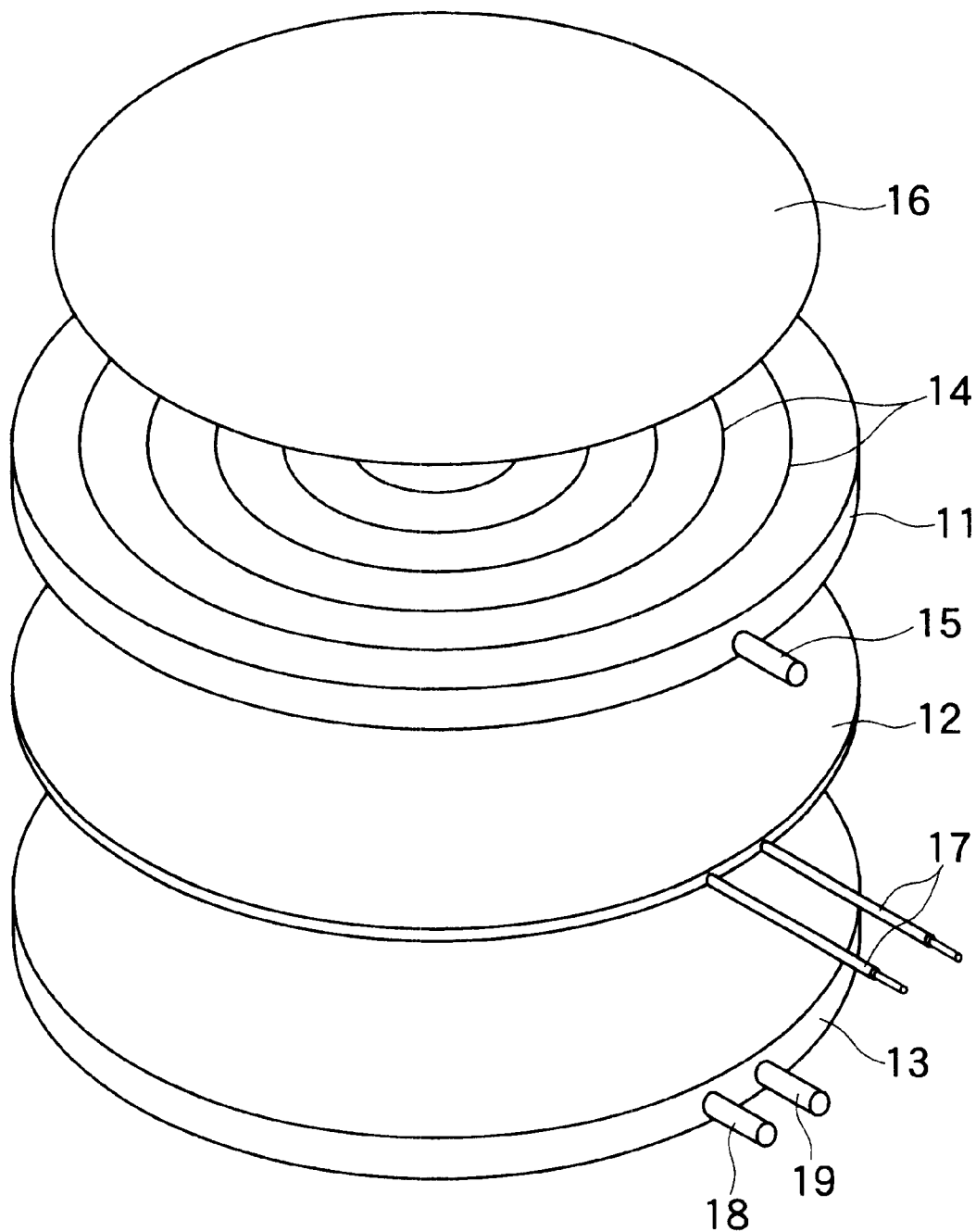
FIG. 1 is an exploded view of the conventional wafer chucking device.
Figure 2:
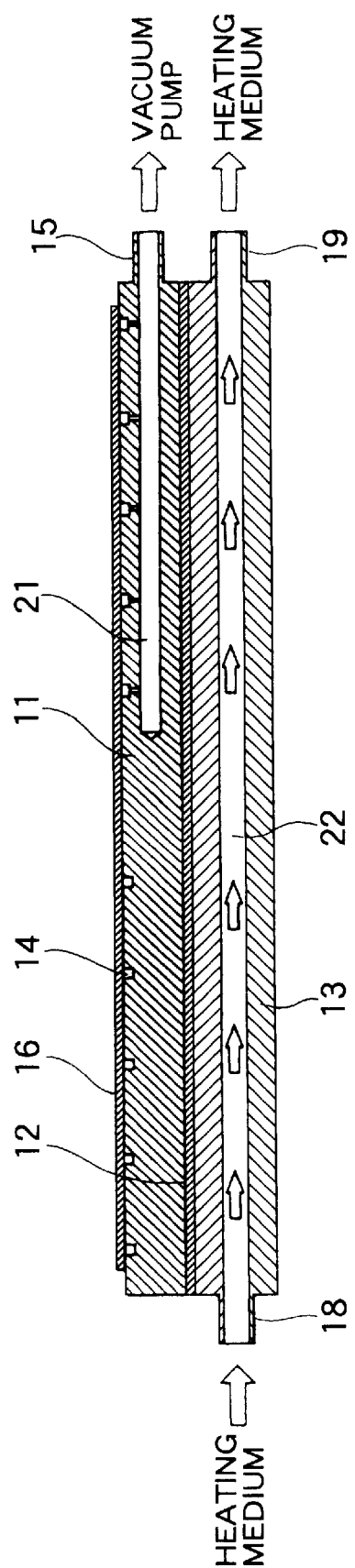
FIG. 2 is a cross section of the conventional wafer chucking device of FIG. 1.

FIG. 1 is an exploded view of the conventional wafer chucking device which is used for both of a high temperature test and a low temperature test of a semiconductor device manufactured on a semiconductor wafer. FIG. 2 shows a cross section of the conventional wafer chucking device illustrated in FIG. 1.

As shown in FIGS. 1 and 2, the wafer chucking device has a thick disk shape and comprises a vacuum disk unit (or a vacuum chucking unit) 11, an electric heater unit 12, and a cooling disk unit 13. The vacuum disk unit 11 is superposed or laid on the electric heater unit 12 while the electric heater unit 12 is superposed on the cooling disk unit 13.

The vacuum disk unit 11 is made of aluminum and has a thickness of, for instance, 12 mm. The vacuum disk unit 11 has a plurality of concentric circular channels 14 formed on its upper surface. Moreover, the vacuum disk unit 11 has an evacuating tunnel or passage 21 in its inside. The evacuating tunnel 21 leads to each of the concentric circular channels 14. Furthermore, the vacuum disk unit 11 has an outlet 15 connected to the evacuating tunnel 21 on its side surface. The outlet 15 is connected to a vacuum pump (not shown) with a connecting pipe (not shown). When a semiconductor wafer 16 is put on the upper surface of the vacuum disk unit 11, it closes the concentric circular channels 14. In this state, if the vacuum pump evacuates air in the evacuating tunnel 21, internal pressure of the circular channels 14 reduces and thereby the vacuum disk unit 11 sucks the semiconductor wafer 16. For instance, the vacuum disk unit 11 has a suction power (or pressure) of about −0.05 MPa. Thus, the vacuum disk unit 11 can hold the semiconductor wafer 16.

The electric heater unit 12 has a thickness of about 4 mm and a pair of leads 17. The electric heater unit 12 generates heat by supplying electrical current between the leads 17 and heats the semiconductor wafer 16 through the vacuum disk unit 11. Inasmuch as the semiconductor wafer 16 is very thin and has small heat capacity, the temperature of the semiconductor wafer 16 immediately follows temperature change of the vacuum disk unit 11. The electric heater unit 12 is used not only for the high temperature test but also for the low temperature test to adjust the temperature of the semiconductor wafer 16. The high temperature test is, for example, carried out at a temperature between the room temperature and about 150° C. while the low temperature test is carried out at a temperature between about −10° C. and −50° C.

The cooling disk unit 13 has a passage 22 (e.g. a channel having a width of 5 mm or a tunnel having a diameter of 5 mm) for passing cooling fluid or heat carrier (e.g. coolant or refrigerant) therethrough. In addition, the cooling disk unit 13 has an inlet 18 and an outlet 19 connected to the passage 22. The inlet 18 and the outlet 19 are connected to a refrigerator (not shown) to circulate the cooling fluid refrigerated by the refrigerator. The cooling fluid passing through the passage 22 cools the cooling disk unit 13 and in turn the cooling disk unit 13 cools the vacuum disk unit 11 through the heater unit 12. When the vacuum disk unit 11 is cooled, the temperature of the semiconductor wafer 16 immediately falls down to almost the same temperature as the vacuum disk unit 11 for the reason mentioned above. The cooling disk unit 13 is used not only for the low temperature test but also for the high temperature test to prevent the semiconductor device formed on the semiconductor wafer 16 from being overheated.

Figure 3:
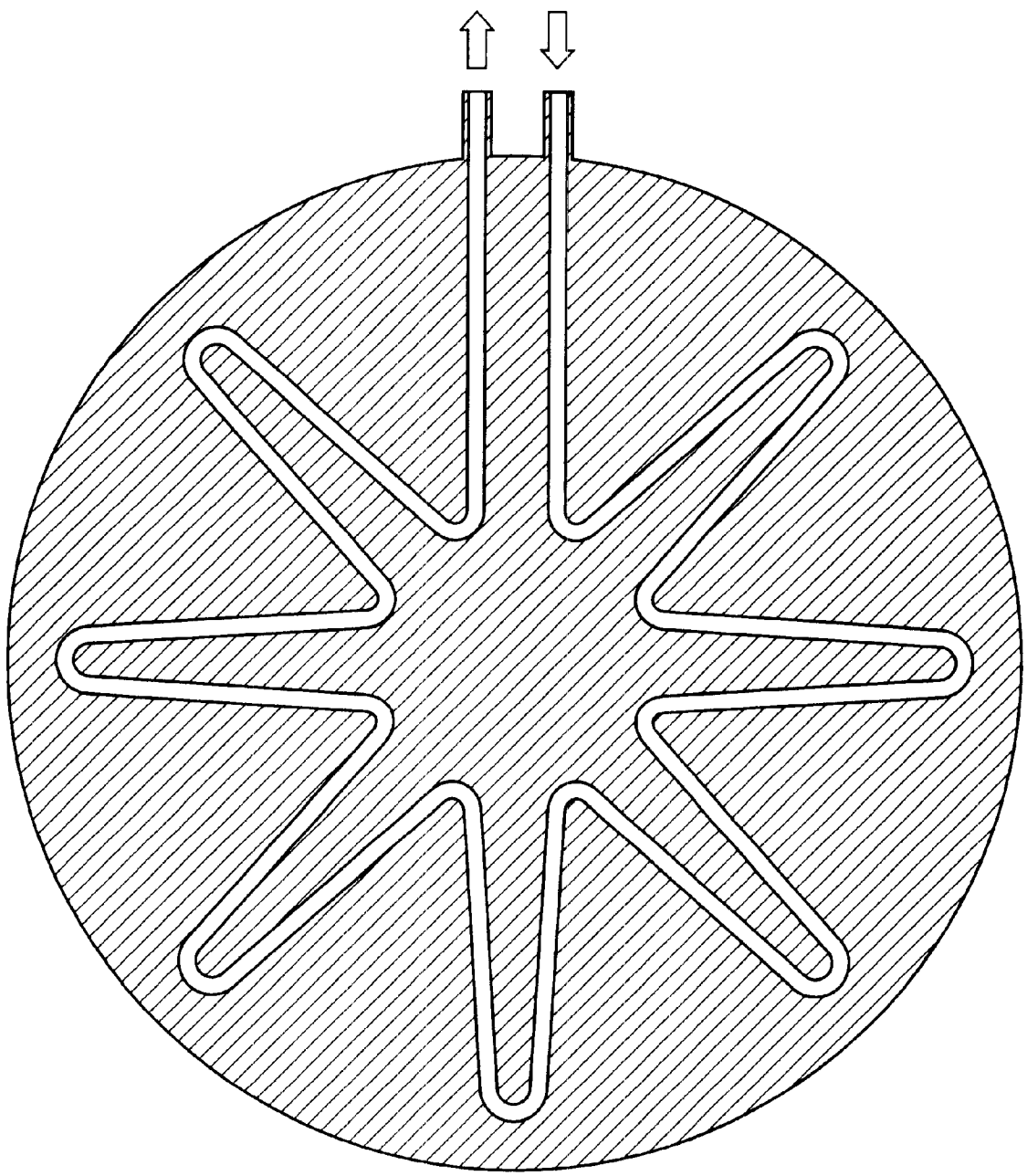
FIG. 3 is a horizontal section of a cooling disk unit used in the conventional wafer chucking device of FIG. 1.
Figure 4:
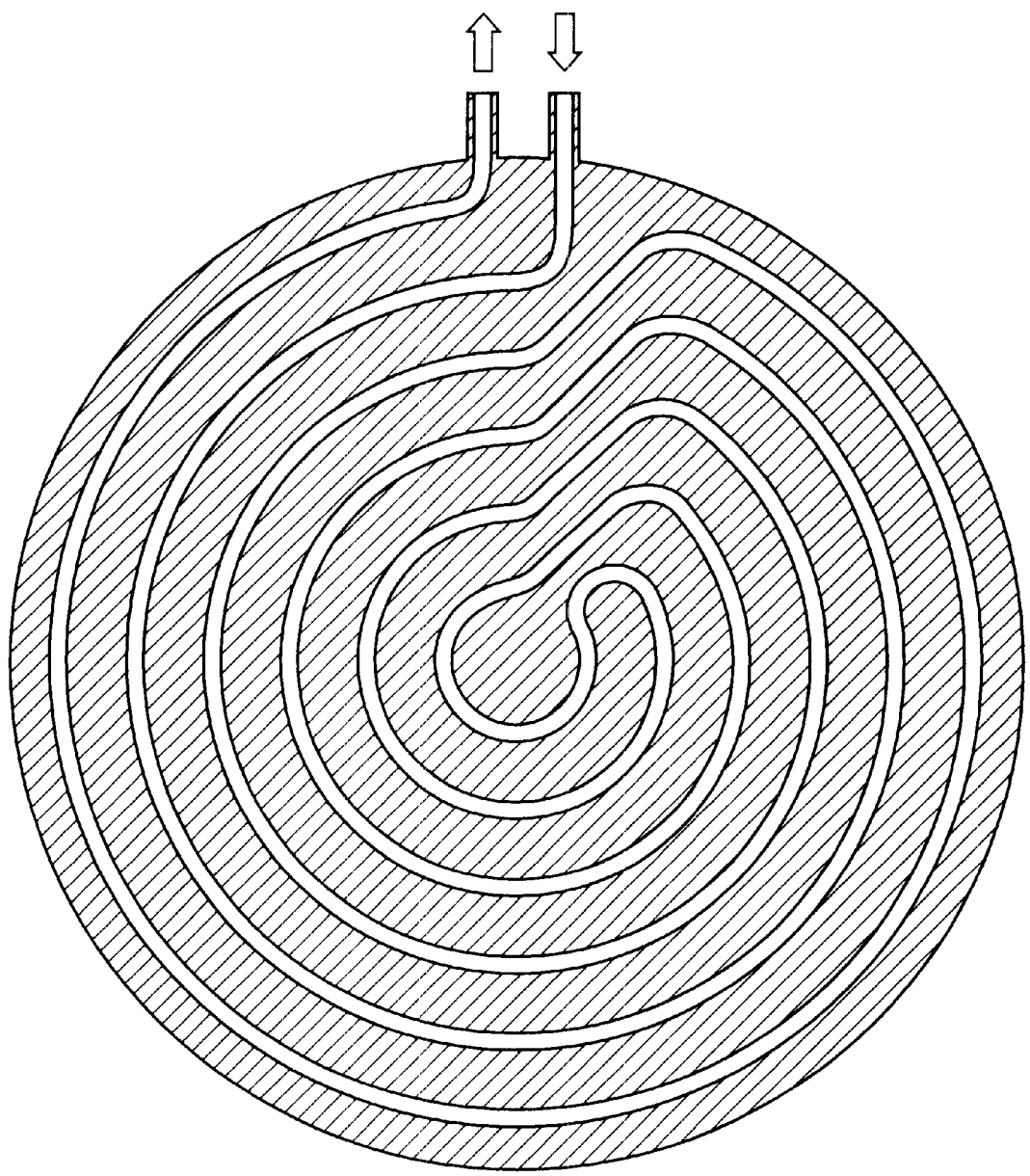
FIG. 4 is a horizontal section of another cooling disk unit used in the conventional wafer chucking device of FIG. 1.
Figure 5:
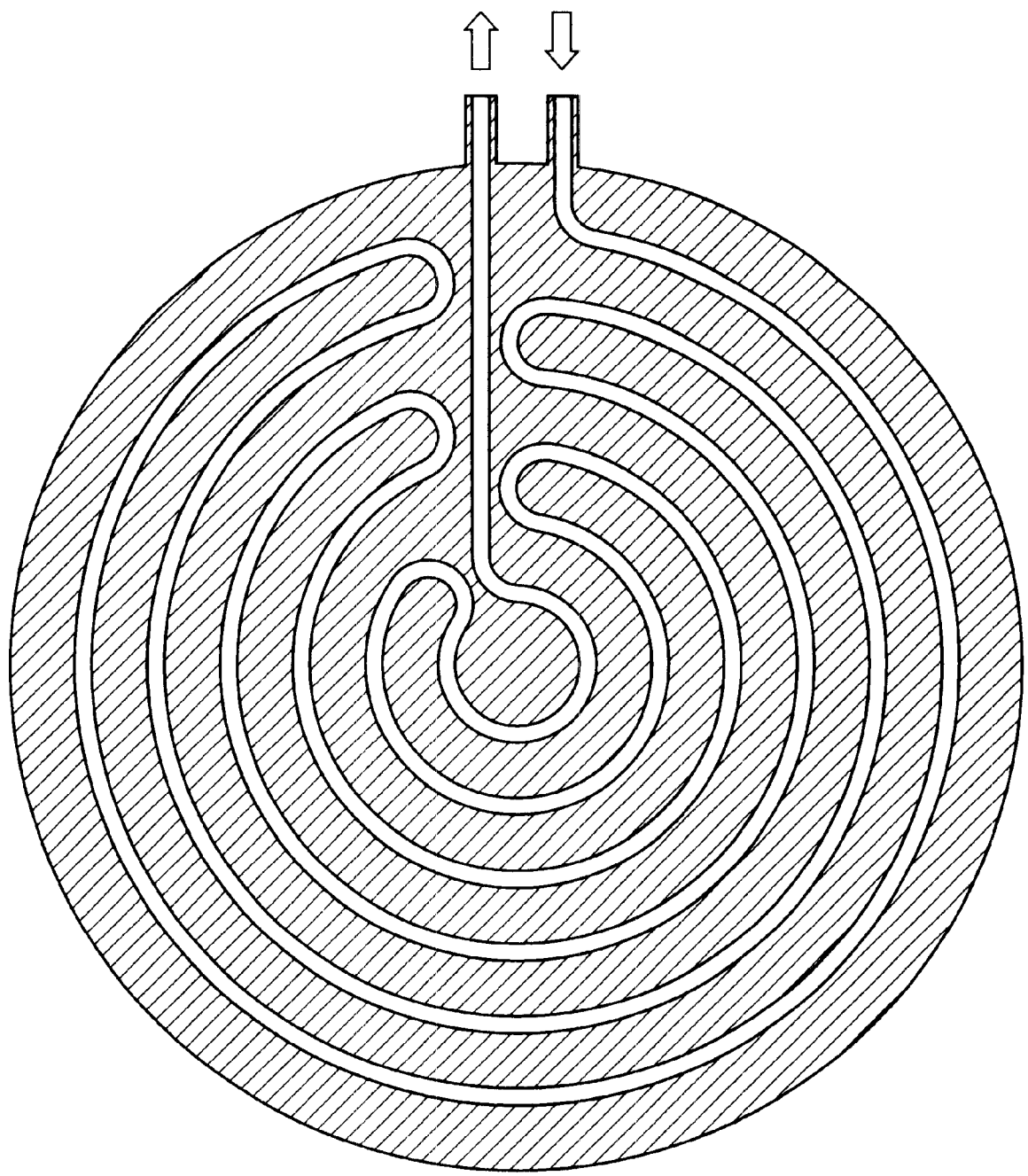
FIG. 5 is a horizontal section of still another cooling disk unit used in the conventional wafer chucking device of FIG. 1.

Although, the passage 22 is illustrated straight in FIG. 2, it is actually curved and/or bent many times. For example, the passage 22 has a star-like shape as illustrated in FIG. 3, a double spiral-like shape as illustrated in FIG. 4, or a meander-like shape as shown in FIG. 5.

Additionally, though the wafer chucking device has the cooling disk unit 13 independent of the vacuum disk unit 11, there is known another conventional wafer chucking device which comprises a vacuum disk unit serving as the cooling disk unit. In this chucking device, the vacuum disk unit has a passage for passing the cooling fluid to serve as the cooling disk unit.

In the meantime, the cooling disk unit 13 has only the single passage 22. Though it is possible to form several passages for passing the cooling fluid in the cooling disk unit 13, it is not enough yet. That is why the cooling disk unit 13 has a small heat transfer area (i.e. inner surface of the passage 22) for heat-transfer to the cooling fluid. Accordingly, heat-transfer is inefficiently carried out between the cooling disk unit 13 and the cooling fluid. That is, the cooling disk unit 13 has a problem that it has a low heat transfer rate.

Apparently, it is possible to solve the problem by increasing the heat transfer area. Enlarging the diameter (equivalent diameter decided by the width and the depth) of the passage 22 increases the heat transfer area. However, enlarging the diameter of the passage 22 does not increase the heat transfer rate. This is because the cooling fluid has a temperature characteristic such that its viscosity becomes large with fall of its temperature. That is, the cooling fluid flows as laminar flow when it is cold. In such a case, the heat transfer rate is in inverse proportion to the diameter of the passage 22. Accordingly, enlarging the diameter reduces the heat transfer rate. In addition, it is difficult to lengthen the total length of the passage 22 when the diameter is large.

Thus, it is necessary to reduce the diameter and to lengthen the total length of the passage 22 in order to enlarge the heat transfer area and to increase the heat transfer rate.

Herein, the heat transfer rate depends on a flow rate of the cooling fluid. Accordingly, it is necessary to increase flow speed of the cooling fluid to keep or increase the flow rate when the diameter becomes small.

However, it is necessary to increase supply pressure of the cooling fluid with reduction of the diameter to keep a certain flow rate. Similarly, it is necessary to increase the supply pressure of the cooling fluid with extension of the length of the passage 22 to keep the certain flow rate. Thus, a combination of reduction of the diameter and extension of the length of the passage 22 brings another problem that the cooling disk unit 13 needs a large capacity to resist the supply pressure of the cooling fluid. In other words, there is a problem that pressure loss is large in the cooling disk unit with the small diameter and the long length of the passage.

Moreover, the conventional cooling disk unit has still another problem that it has lack of uniformity in temperature distribution on a main or upper surface on which the heater unit is laid.

Referring to FIGS. 6 through 9, description will proceed to a cooling disk unit according to a first embodiment of this invention. The cooling disk unit is used in the wafer chucking device illustrated in FIG. 1 instead of the cooling disk 13.

Figure 6:
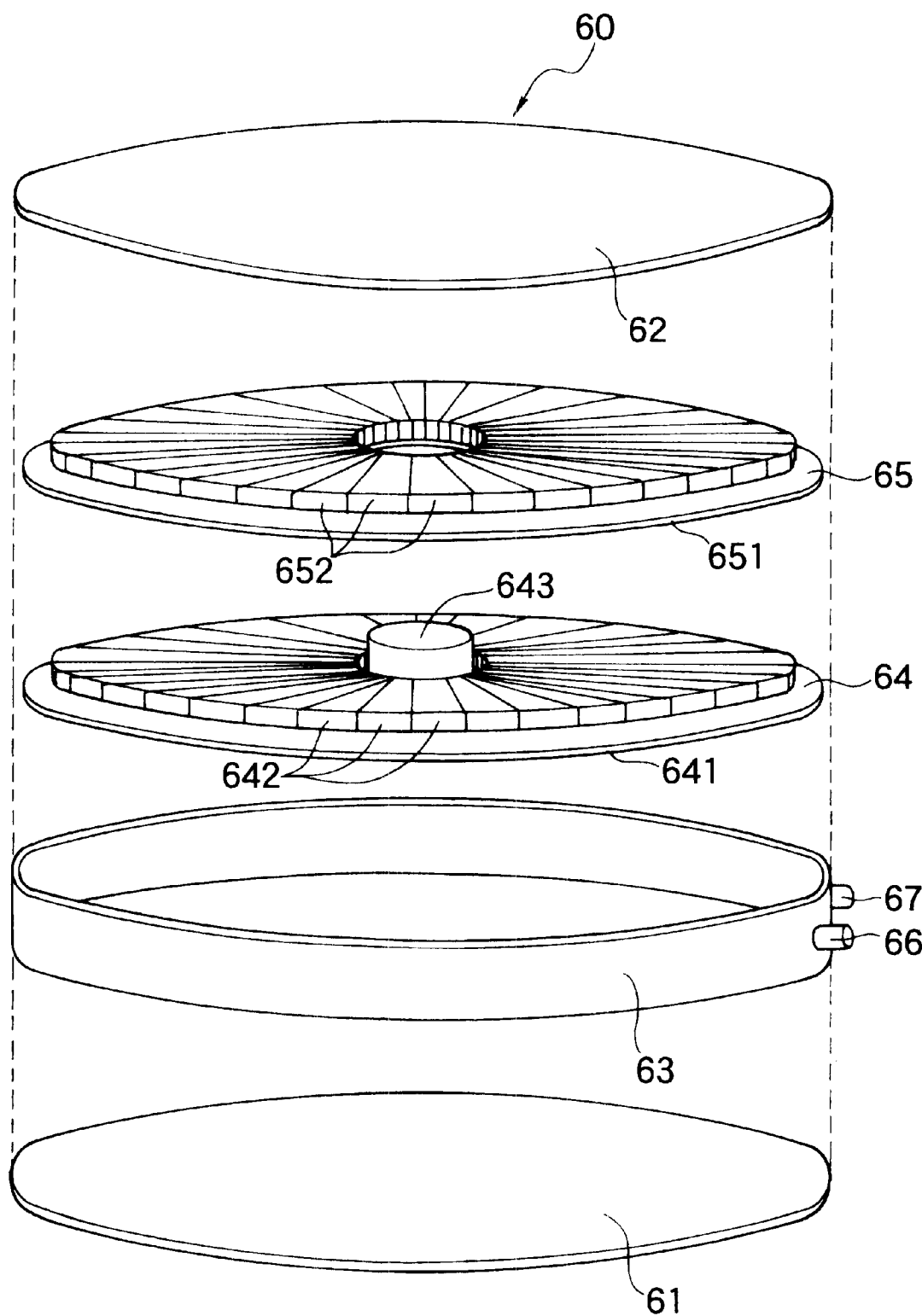
FIG. 6 is an exploded view of a cooling disk unit according to a first embodiment of this invention.

In FIG. 6, the cooling disk unit 60 comprises a casing which has a circular bottom plate 61, a circular top plate 62, and a ring side wall 63. A first heat conducting disk 64 is disposed under a second heat conducting disk 65 in the casing. In other words, the second conducting disk 65 is superposed on the first conducting disk 64 and put in the casing. The first and the second heat conducting disks 64 and 65 carry out heat exchange with a cooling fluid (or refrigerant).

In case where the wafer chucking device is used for chucking a 8-inch wafer, the bottom plate 61 has a diameter slightly larger than 200 mm and a thickness of about 2 mm. The bottom plate 61 is made of metal such as copper, stainless, and titanium. The top plate 62 is similar to the bottom plate 61. The side wall 63 is made of the same metal as the bottom plate 61 and has an outside diameter equal to a diameter of the bottom plate 61. Moreover, the side wall 63 has an inlet 66 and an outlet 67 on an outer peripheral surface for introducing and discharging the cooling fluid, respectively. The casing is formed by brazing the side wall 63 to both of the bottom plate 61 and the top plate 62. It is desirable that the casing is made of stainless steel or titanium rather than copper because the copper is inferior to stainless steel and titanium in both mechanical strength and heat resistance. In other words, it is desirable that the casing is made of metal harder than copper.

The first heat conducting disk 64 comprises a circular plate member 641, a large number of sectorial (or wedged) members 642, and a cylindrical member 643. These members 641, 642 and 643 are made of metal having large thermal conductivity, such as copper, copper alloy, aluminum, and aluminum alloy. The plate member 641 has a diameter equal to an inside diameter of the side wall 63 and has a thickness of about 2 mm. The sectorial members 642 are arranged in a circle at intervals of about 0.5–1 mm on the plate member 641. The circle formed by the sectorial members 642 has an outer diameter which is about 24 mm smaller than the diameter of the plate member 641, and an inside diameter of about 28 mm. The sectorial members 642 are fixed to the plate member 641 by brazing or gluing. Though the number of the sectorial members 642 is not limited, it is desirable that the number is large. The cylindrical member 643 has an outer diameter of about 18 mm and a thickness of about 6 mm and is fixed to the center of the plate member 641 by brazing or gluing.

The second heat conducting disk 65 is similar to the first heat conducting disk 64 except for the central part. That is, the second heat conducting disk 65 comprises a circular plate member 651 which has an opening having a diameter of about 28 mm and formed at a center. Sectorial members 652 are arranged on the plate member 651 like the sectorial member 642. The second heat conducting disk 65 does not have a cylindrical member like the cylindrical member 643.

The heat conducting disks 64 and 65 are formed by brazing or gluing a lot of members as mentioned above. Alternatively, the heat conducting disks 64 and 65 may be made by carving thick metal disks.

The second heat conducting disk 65 is superposed or disposed on the first heat conducting disk 64 so that their central axes coincide with each other. Then, the heat conducting disks 64 and 65, which are brazed or glued to each other, are put into the casing and fixed to the casing by way of preplaced brazing using gold solder.

Figure 7:
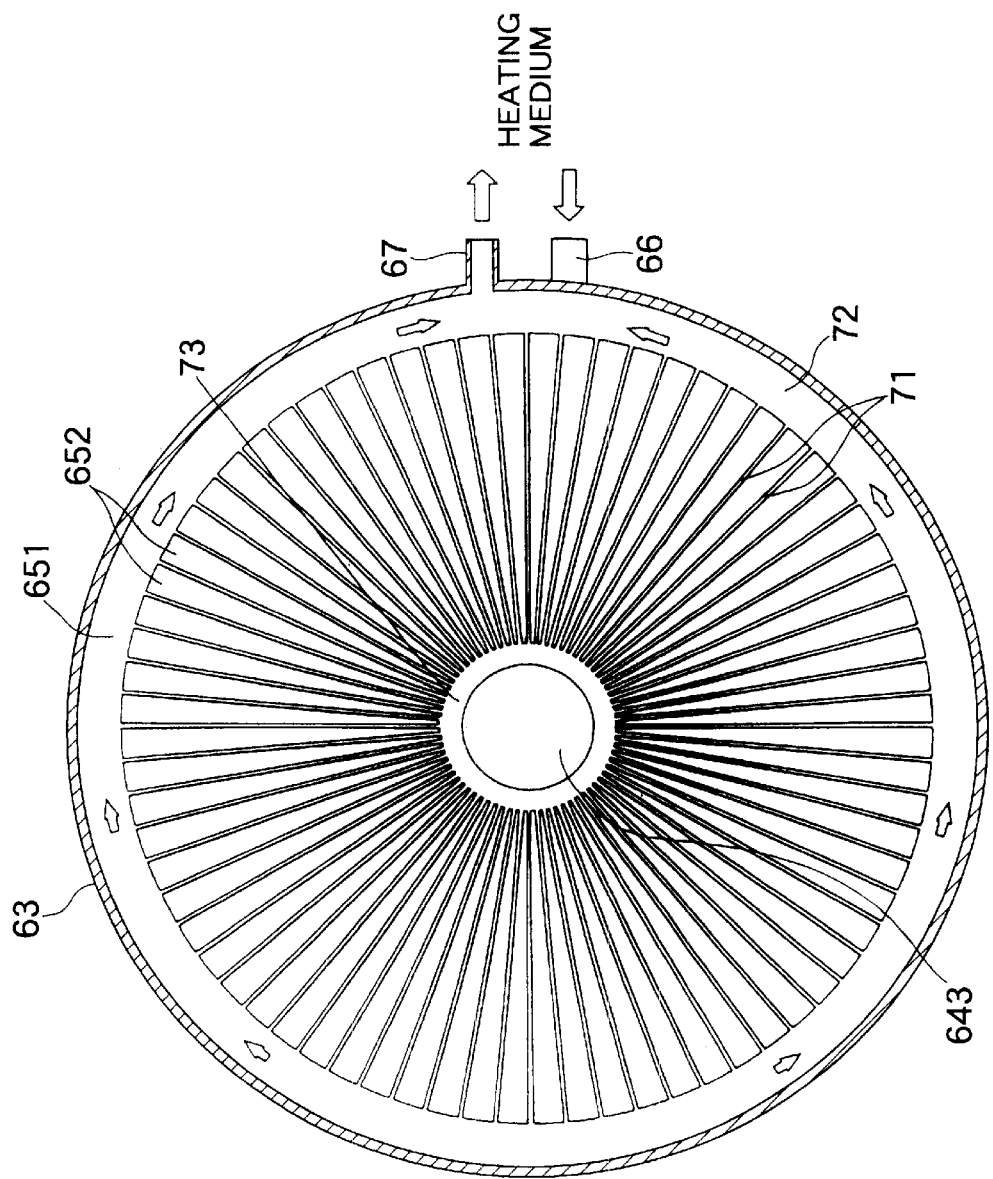
FIG. 7 shows a heat conducting disk contained in a casing and used in the cooling disk unit of FIG. 6.

FIG. 7 shows a state where the heat conducting disks 64 and 65 are contained in the casing with the top plate 62 removed therefrom. As shown in FIG. 7, the sectorial members 652 provide a plurality of radial channels 71 between every adjoined two of them. Moreover, the sectorial members 652 and the side wall 63 form an outside ring channel 72 which connects the radial channels 71 to one another at outer ends of the radial channels 71 and which has a width much larger than that of each radial channel 71. Furthermore, the sectorial members 652 and the cylindrical member 643 form an inside ring channel 73 which connects the radial channels 71 to one another at inside ends of the radial channels 71 and which extends from the second heat conducting disk 65 to the first heat conducting disk 64. That is, the inside ring channel 73 serves as a connecting passage connecting the first heat conducting disk 64 and the second heat conducting disk 65.

As regards the first heat conducting disk 64, the sectorial members 642 similarly provide a plurality of radial channels (81 of FIG. 8) between every adjoined two of them. Moreover, the sectorial members 642 and the side wall 63 form an outside ring channel (82 of FIG. 8) like the outside ring channel 72. The outside ring channel (82) connects the radial channels (81) to one another at the outside ends of the radial channels (81). In addition, the radial channels (81) are connected to the inside ring channel 73 at the inside ends.

Figure 8:
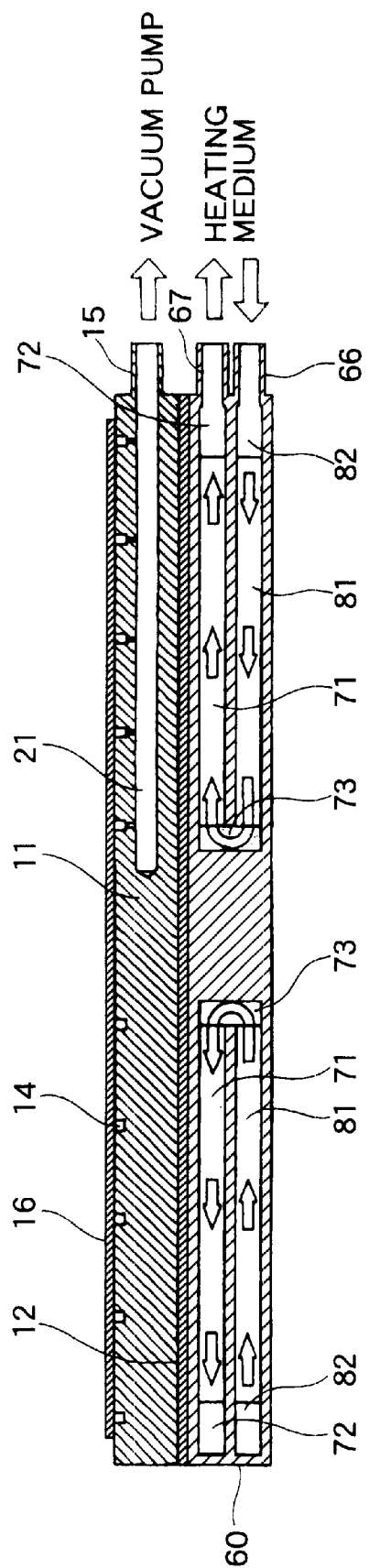
FIG. 8 is a cross section of a wafer chucking device including the cooling disk unit of FIG. 6.

FIG. 8 shows a cross sectional view of the wafer chucking device including the cooling disk unit 60. In FIG. 8, the casing, the first heat conducting disk 64 and the second heat conducting disk 65 are illustrated as one piece. In addition, the inlet 66 and the outlet 67 are different in position from those of FIG. 7.

An operation of the wafer chucking device will presently be described with reference to FIGS. 6 through 8.

At first, a cooling fluid supplied from a refrigerator (not shown) flows into the cooling disk unit 60 through the inlet 66. The cooling fluid is refrigerated by the refrigerator and has a large viscosity. Accordingly, the cooling fluid which flows in the cooling disk unit 60 flows in the outside ring channel 82 rather than the radial channels 81 because the outside ring channel 82 is wider than each of the radial channels 81. After the outside ring channel 82 is filled up with the cooling fluid, the cooling fluid flows equally into the radial channels 81. Then, the cooling fluid comes together in the inside ring channel 73. When the inside ring channel 73 is filled up with the cooling fluid, the cooling fluid flows equally into the radial channels 71. After the cooling fluid flows into the outside ring channel 72 from the radial channels 71, it flows toward the outlet 67 and is discharged from the outlet 67 to return to the refrigerator.

As mentioned above, the cooling fluid flows in the radial channels 81 and 71 each of which is narrow (small in equivalent diameter) and short. Consequently, the heat transfer rate and the heat transfer area of the cooling disk unit 60 are larger than those of the conventional cooling disk unit 13, respectively. Moreover, the pressure loss of the cooling disk unit 60 is smaller than that of the conventional cooling disk unit 13. For instance, the cooling disk unit 60 having the radial channels 71 and 81, each of which has a width of 1 mm, has a heat transfer rate corresponding to about five times that of the conventional disk unit 13 (as illustrated in FIG. 3, FIG. 4 and FIG. 5) having a passage 22 which has a diameter of 5 mm. In this case, the cooling disk unit 60 also has the heat transfer area corresponding to about five times that of the conventional disk unit 13. As a result, heat transfer of the cooling disk unit 60 is improved by about 25 times in this case as compared with the conventional cooling disk unit 13. Moreover, because the length of each of the radial channels 71 and 81 is short, the pressure loss is small.

In the cooling disk unit 60, the cooling fluid flows inward in the first heat conducting disk 64 (especially the radial channels 81) and flows outward in the second heat conducting disk 65 (especially the radial channels 71). Consequently, the cooling disk unit 60 has a substantially uniform temperature distribution on the upper surface. That is, the surface temperature at the outside part of the cooling disk 60 is nearly equal to that at the middle part of it.

Figure 9:
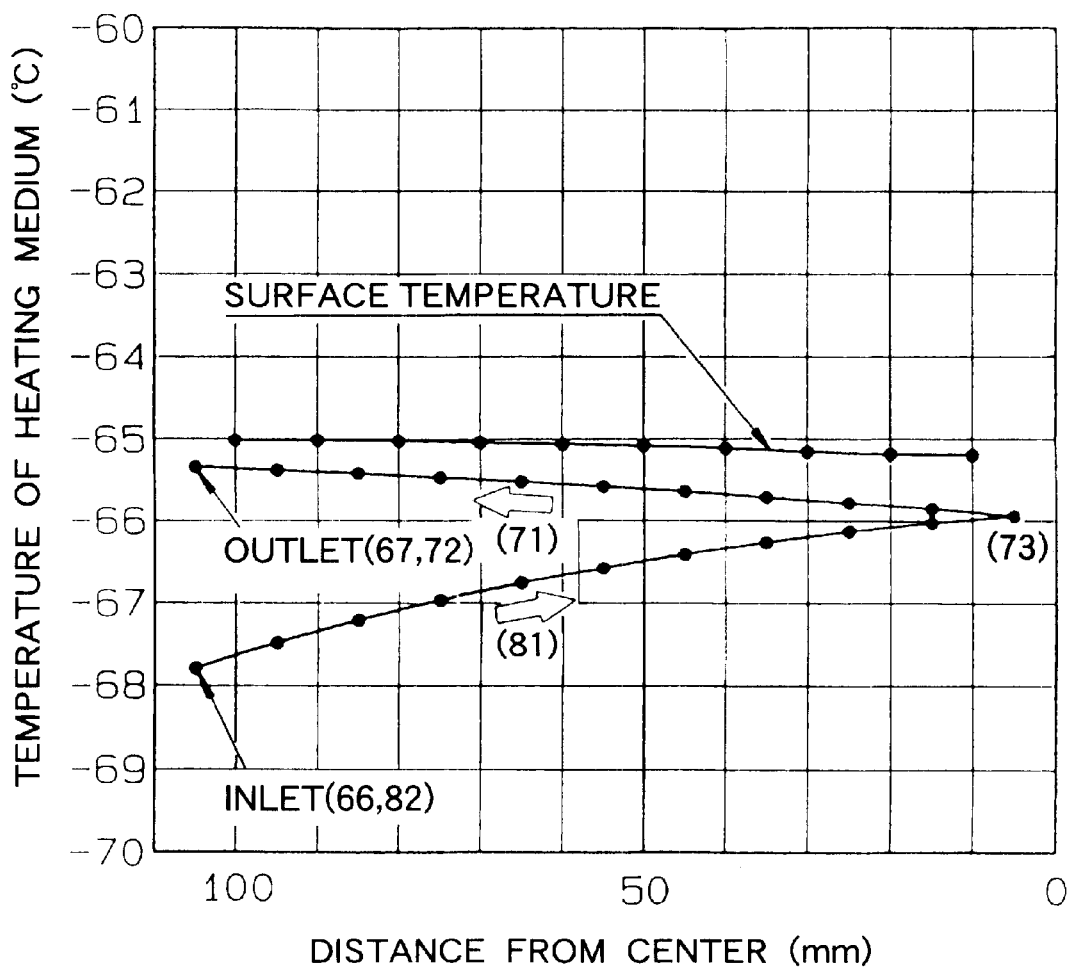
FIG. 9 is a graph showing relationships between a surface temperature and a distance from a center of a cooling disk unit of FIG. 6 and between a temperature of a cooling fluid flowing in the cooling disk unit of FIG. 6 and the distance.

FIG. 9 is a graph which shows the relationships between the surface temperature and the distance from the center of the cooling disk unit 60 and between a temperature of the cooling fluid and the above-mentioned distance. In FIG. 9, a horizontal axis represents the distance while a vertical axis represents the temperatures of the cooling fluid and the surface.

As shown in FIG. 9, the temperature of the cooling fluid is the lowest at the inlet 66 or at the outside ring channel 82. The temperature of the cooling fluid rises with the flow from the inlet 66 to the internal ring channel 73. Moreover, the temperature of the cooling fluid further rises with the flow from the internal ring channel 73 to the outside ring channel 72 or the outlet 67. As the cooling fluid is colder, the quantity of heat transferred between the cooling fluid and the cooling disk unit 60 is larger. However, the surface temperature is decided by the sum of the cooling ability of the cooling fluid flowing in the radial channels 81 and the cooling ability of the cooling fluid flowing in the radial channels 71. Accordingly, the cooling disk unit 60 has the substantially uniform surface temperature in a radial direction.

Next, description will be made of a cooling disk unit according to a second embodiment of this invention.

Figure 10:
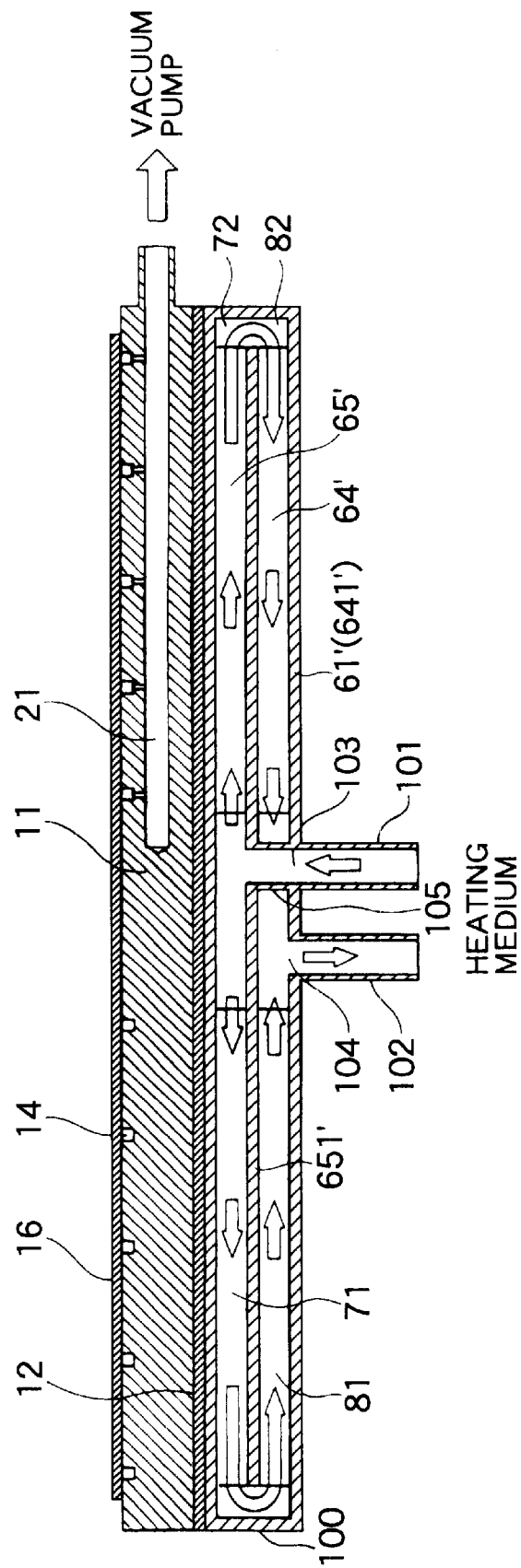
FIG. 10 is a cross section of a wafer chucking device including a cooling disk unit according to a second embodiment of this invention.

Referring to FIG. 10, the cooling disk unit 100 comprises a casing provided with an inlet 101 and an outlet 102 formed at a middle part of a circular bottom plate 61'. A first heat conducting disk 64' has a plate member 641' having a pair of through holes 103 and 104 at the middle part. The through holes 103 and 104 correspond to the inlet 101 and the outlet 102, respectively. A second heat conducting disk 65' has a connecting pipe 105 connecting a plate member 651' with the inlet 101 through the through hole 103.

As easily understood from FIG. 10, the first heat conducting disk 64' does not have the cylindrical member 643 while the second heat conducting disk 65' does not have the opening at the center. That is, the cooling disk unit 100 does not have the inside ring channel 73. However, the cooling disk unit 100 has an outer ring channel formed by the outside ring channels 72 and 82. The outer ring channel is made by matching a diameter of the plate member 651' to the outer diameter of the circle formed by the sectorial members 652.

In this structure, the cooling fluid, which flows into the middle part of the second heat conducting disk 65' through the inlet 101, radially moves in the radial channels 71. After the cooling fluid reaches the outside ring channel 72, it flows into the radial channels 81 of the first heat conducting disk 64' through the outside ring channel 82. Then, the cooling fluid, which flows into the radial channels 81, gathers in the middle part of the second heat conducting disk 64' and runs out through the outlet 102.

The cooling disk unit 100 has the heat transfer rate and the heat transfer area larger than those of the conventional cooling disk unit 13, respectively, like the cooling disk unit 60. Moreover, the pressure loss of the cooling disk unit 100 is smaller than that of the conventional cooling disk unit 13. In addition, the cooling disk unit 100 has a substantially uniform temperature distribution on the upper surface.

While this invention has thus far been described in conjunction with a few embodiments thereof, it will readily be possible for those skilled in the art to put this invention into practice in various other manners. For example, one or more additional inlets and outlets may be provided on the outer peripheral surface of the ring side wall 63. In this case, it is desirable that the inlets and outlets are arranged at regular interval in a circumferential direction. Moreover, the cooling fluid may flow in the opposite direction opposite to arrows drawn in FIG. 8 or 10. Furthermore, the inlet 101 and the outlet 102 may be provided by the second and the first heat conducting disks 65' and 64', respectively. Still furthermore, the plate member 641 may serve as the bottom plate 61.

What is claimed is:

1. A cooling disk unit for cooling a wafer chucking device by exchanging heat with a cooling fluid passing therethrough, said cooling disk unit comprising:

a first heat conducting disk having a plurality of first radial channels which are connected to one another at both first inside ends and first outside ends, wherein heat is exchanged between said first heat conducting disk and said cooling fluid flowing inward in said first radial channels; and a second heat conducting disk concentrically disposed on either a top or a bottom of said first heat conducting disk and having a plurality of second radial channels connected to one another at both second inside ends and second outside ends and connected to said first radial channels at either one of said second inside ends or said second outside ends, wherein heat is exchanged between said second heat conducting disk and said cooling fluid flowing outward in said second radial channels, wherein said first and second radial channels have equal diameters relative to each other, and wherein said first and second radial channels are connected in a serial manner and the cooling fluid flowing in a one direction through either one of said first and second radial channels is constrained to flow in an opposite direction through said other one of said first and second radial channels.

2. A cooling disk unit as claimed in claim 1, wherein said first heat conducting disk comprises a first circular plate member, a plurality of first sectorial shaped members arranged in a circle at regular intervals on said first circular plate member, wherein said regular intervals correspond to said equal diameter of said first and second radial channels; and said second heat conducting disk comprising a second circular plate member, a plurality of second sectorial shaped members arranged in a circle at regular intervals on said second circular plate member.

3. A cooling disk for cooling a wafer chucking device by exchanging heat with a cooling fluid passing therethrough, said cooling disk unit comprising:

a first heat conducting disk having a plurality of first radial channels which are connected to one another at both first inside ends and first outside ends, wherein heat is exchanged between said first heat conducting disk and said cooling fluid flowing inward in said first radial channels; and a second heat conducting disk concentrically disposed on either a top or a bottom of said first heat conducting disk and having a plurality of second radial channels which are connected to one another at both second inside ends and second outside ends and to said first radial channels at either one of said second inside ends or said second outside ends, wherein heat is exchanged between said second heat conducting disk and said cooling fluid flowing outward in said radial channels, wherein said first and second radial channels have equal diameters relative to each other, wherein said first heat conducting disk further has a first outside channel for connecting said first radial channels to one another at said first outside ends; and said second heat conducting disk having a second outside channel for connecting said second radial channels to one another at said second outside ends.

4. A cooling disk unit as claimed in claim 1, wherein said first heat conducting disk and said second heat conducting disk is made of copper, copper alloy, aluminum, or aluminum alloy.

5. A cooling disk unit as claimed in claim 1, wherein said cooling disk further comprises a metallic casing for containing both said first heat conducting disk and said second heat conducting disk.

6. A cooling disk unit for cooling a wafer chucking device by exchanging heat with a cooling fluid passing therethrough, said cooling disk unit comprising:

- a first heat conducting disk having a plurality of first radial channels which are connected to one another at both first inside ends and first outside ends, wherein heat is exchanged between said first heat conducting disk and said cooling fluid flowing inward in said first radial channels; and
- a second heat conducting disk concentrically disposed on either a top or a bottom of said first heat conducting disk and having a plurality of second radial channels which are connected to one another at both second inside ends and second outside ends and to said first radial channels at either one of said second inside ends or said second outside ends, wherein heat is exchanged between said second heat conducting disk and said cooling fluid flowing outward in said second radial channels,
- wherein said first and second radial channels have equal diameters relative to each other,
- wherein said cooling disk further comprises a metallic casing for containing both said first heat conducting disk and said second heat conducting disk, and wherein said metallic casing is made of a metal or an alloy harder than copper.

7. A wafer chucking device comprising:

- a wafer chucking unit for chucking a semiconductor wafer thereon; and
- a cooling disk unit disposed under said wafer chucking unit for cooling said semiconductor wafer through said wafer chucking unit by passing a cooling fluid therethrough, wherein:
- a first heat conducting disk having a plurality of first radial channels which are connected to one another at both first inside ends and first outside ends, wherein heat is exchanged between said first heat conducting disk and said cooling fluid flowing inward in said first radial channels; and
- a second heat conducting disk concentrically disposed on either a top or a bottom of said first heat conducting disk and having a plurality of second radial channels connected to one another at both second inside ends and second outside ends and connected to said first radial channels at either one of said second inside ends or said second outside ends,
- wherein heat is exchanged between said second heat conducting disk and said cooling fluid flowing outward in said second radial channels,
- wherein said first and second radial channels have equal diameters relative to each other, and
- wherein said first and second radial channels are connected in a serial manner and the cooling fluid flowing in a one direction through either one of said first and second radial channels is directed to flowing in an opposite direction through said other one of said first and second radial channels.

* * * * *